United States Patent
Kwon et al.

(10) Patent No.: US 10,777,363 B2
(45) Date of Patent: Sep. 15, 2020

(54) LEAD-FREE PEROVSKITE-BASED HOLE TRANSPORT MATERIAL COMPOSITES, SOLAR CELLS INCLUDING THE SAME, AND METHOD OF MANUFACTURING THE SAME

(71) Applicant: UNIST (ULSAN NATIONAL INSTITUTE OF SCIENCE AND TECHNOLOGY), Ulsan (KR)

(72) Inventors: Tae-Hyuk Kwon, Ulsan (KR); HyeonOh Shin, Ulsan (KR); Byung-Man Kim, Ulsan (KR)

(73) Assignee: UNIST (ULSAN NATIONAL INSTITUTE OF SCIENCE AND TECHNOLOGY), Ulsan (KR)

( * ) Notice: Subject to any disclaimer, the term of this patent is extended or adjusted under 35 U.S.C. 154(b) by 176 days.

(21) Appl. No.: 15/848,969

(22) Filed: Dec. 20, 2017

(65) Prior Publication Data
US 2018/0337004 A1 Nov. 22, 2018

(30) Foreign Application Priority Data
May 19, 2017 (KR) .......................... 10-2017-0062118

(51) Int. Cl.
*H01G 9/20* (2006.01)
*H01L 51/00* (2006.01)
(Continued)

(52) U.S. Cl.
CPC .......... *H01G 9/2009* (2013.01); *C01D 17/00* (2013.01); *C01G 30/002* (2013.01); *H01G 9/2018* (2013.01); *H01L 51/0067* (2013.01); *H01L 51/4226* (2013.01); *C01P 2002/34* (2013.01); *C01P 2002/72* (2013.01); *C01P 2004/61* (2013.01); *C01P 2004/62* (2013.01); *C01P 2004/64* (2013.01); *H01G 9/2031* (2013.01); *H01G 9/2059* (2013.01); *H01L 51/4213* (2013.01)

(58) Field of Classification Search
None
See application file for complete search history.

(56) References Cited

U.S. PATENT DOCUMENTS

| | | | |
|---|---|---|---|
| 2015/0249170 A1* | 9/2015 | Snaith | H01L 51/422 136/256 |
| 2016/0211083 A1 | 7/2016 | Kanatzidis et al. | |
| 2016/0351344 A1* | 12/2016 | Kitsuda | H01G 9/2077 |

FOREIGN PATENT DOCUMENTS

KR 1020160025144 A 3/2016

OTHER PUBLICATIONS

Lee et al., "Air-Stable Molecular Semiconducting Iodosalts for Solar Cell Applications: Cs2SnI6 as a Hole Conductor", Journal of the American Chemical Society, 2014, 136, pp. 15379-15385. (Year: 2014).*

(Continued)

*Primary Examiner* — Tamir Ayad
(74) *Attorney, Agent, or Firm* — Heslin Rothenberg Farley & Mesiti P.C.

(57) ABSTRACT

Provided are a hole transport material composite including a lead-free perovskite ($Cs_2SnI_6$), a liquid ionic conductor and a solvent that is a solid at a room temperature, a solar cell, and a method of manufacturing the lead-free perovskite-based hole transport material composite.

15 Claims, 12 Drawing Sheets

(51) Int. Cl.
H01L 51/42 (2006.01)
C01D 17/00 (2006.01)
C01G 30/00 (2006.01)

(56) References Cited

OTHER PUBLICATIONS

Byrne et al. "Succinonitrile-based solid-state electrolytes for dye-sensitised solar cells", Progress in Photovoltaics: Research and Applications, 2015, 23; 417-427. (Year: 2013).*
Lee et al., "Solution processing of air-stable molecular semiconducting iodosalts, Cs2SnI6-xBrx, for potential solar cell applications", Sustainable Energy & Fuels, DOI: 10.1039/c7se00100b; vol. 1, No. 4 pp. 667-942. Published Mar. 20, 2017 (Year: 2017).*
Lee, B., et al., "Solution processing of air-stable molecular semiconducting iodosalts, $Cs_2SnI_{6-x}Br_x$, for potential solar cell applications", *Sustainable Energy & Fuels*, vol. 1, No. 4, pp. 710-724 (2017).
Lee, B., et al., "Solution processing of air-stable molecular semiconducting iodosalts, $Cs_2SnI_{6-x}Br_x$ for potential solar cell applications", *Sustainable Energy & Fuels*, Issue 4 (2017).
Byrne, O., et al., "Succinonitrile based solid state electrolytes for dye sensitized solar cells", Progress in Photovoltaics, vol. 23, Issue 4, pp. 417-427 (2015).

\* cited by examiner

*: Succinonitrile only
1: $Cs_2SnI_6$ in succinonitrile
2: DMPII in succinonitrile
3: $Cs_2SnI_6$ & DMPII in succinonitrile

LEAD-FREE PEROVSKITE-BASED HOLE TRANSPORT MATERIAL COMPOSITES, SOLAR CELLS INCLUDING THE SAME, AND METHOD OF MANUFACTURING THE SAME

CROSS-REFERENCE TO RELATED APPLICATION

This application claims the benefit of Korean Patent Application No. 10-2017-0062118, filed on May 19, 2017, in the Korean Intellectual Property Office, the disclosure of which is incorporated herein by reference.

BACKGROUND

1. Field of the Invention

One or more example embodiments relate to a lead-free perovskite-based hole transport material composite, a solar cell including the lead-free perovskite-based hole transport material composite, and a method of manufacturing the lead-free perovskite-based hole transport material composite.

2. Description of the Related Art

Lead-based perovskite is receiving attention as an active layer material of a next-generation solar cell due to a characteristic of the lead-based perovskite, for example, an absorption of a wide area of 300 nanometers (nm) to 800 nm, a high extinction coefficient, and a bipolarity to smoothly move electrons and holes.

However, the lead-based perovskite has a limitation in a commercialization as a solar cell due to a toxicity and poisoning by lead that is a central element. To solve the above issue, a lead-free perovskite in which lead is replaced by bismuth (Bi), cooper (Cu) and tin (Sn) that are other central elements is provided.

Although a tin-based perovskite having an oxidation number of +2 reaches an efficiency exceeding about 6%, a stability of the tin-based perovskite decreases because the tin-based perovskite is easily oxidized in the air. Also, a perovskite having another central element is excellent in a stability, however, fails to reach a high efficiency as an active layer.

Generally, a dye-sensitized solar cell is fabricated using an iodine redox electrolyte, however, has an issue of a long-term stability due to a high volatility and a leakage of an electrolyte(*electrolyte solution. Accordingly, research on a lead-free perovskite has been conducted by an application of the lead-free perovskite to a hole transport material of a dye-sensitized solar cell as well as an active layer in a solar cell. However, since a solution process of dissolving the lead-free perovskite in a solvent and coating a layer is applied, there is an issue that needs to enhance a stability, a reproducibility and an efficiency based on the solution process.

SUMMARY

The present disclosure is to solve the foregoing problems, and example embodiments provide a lead-free perovskite-based hole transport material composite that may have an enhanced reproducibility and enhanced performance and that may enhance an efficiency of a solar cell.

Example embodiments provide a solar cell including a lead-free perovskite-based hole transport material composite.

Example embodiments provide a method of manufacturing a lead-free perovskite-based hole transport material composite.

However, the problems to be solved in the present disclosure are not limited to the foregoing problems, and other problems not mentioned herein would be clearly understood by one of ordinary skill in the art from the following description.

According to an aspect, there is provided a hole transport material composite including a lead-free perovskite ($Cs_2SnI_6$), a solvent, and a liquid ionic conductor, wherein the solvent is a solid at a room temperature.

The lead-free perovskite may be included in an amount of 0.1 to 10 parts by weight, the solvent may be included in an amount of 80 to 99 parts by weight, and the liquid ionic conductor may be included in an amount of 0.1 to 20 parts by weight, based on 100 parts by weight of the hole transport material composite.

A mass ratio of the lead-free perovskite to the liquid ionic conductor may range from 1:1 to 1:5.

A mass ratio of the solvent to the lead-free perovskite may range from 1:0.1 to 1:0.5.

A mass ratio of the solvent to the liquid ionic conductor may range from 1:0.1 to 1:0.5.

The solvent may be succinonitrile.

The liquid ionic conductor may include at least one of 1-butyl-3-methyl imidazolium iodide, 1-allyl-3-methylimidazolium iodide, 1,3-dimethylimidazolium iodide, 1-hexyl-2,3-dimethylimidazolium iodide, 1-butyl-2,3-dimethylimidazolium iodide, 1-dodecyl-3-methylimidazolium iodide, 1-butyl-3-methylimidazolium iodide, 1,2-dimethyl-3-propylimidazolium iodide (DMPII), 1-ethyl-3-methylimidazolium iodide, 1-hexyl-3-methylimidazolium iodide, 1-methyl-3-propylimidazolium iodide and 4-tert-butylpyridine (TBP).

The lead-free perovskite may be powder with a particle size of 10 nanometers (nm) to 2 micrometers (μm).

According to another aspect, there is provided a solar cell including a light absorption layer including a hole transport material layer including the hole transport material composite, the light absorption layer being located between a first electrode and a second electrode.

The solar cell may include the first electrode, the light absorption layer formed on the first electrode, and the second electrode formed on the light absorption layer. The light absorption layer may include a dye layer, and the hole transport material layer formed on the dye layer.

The hole transport material layer may have a thickness of 10 μm to 30 μm.

According to another aspect, there is provided a method of manufacturing a hole transport material composite, the method including forming a hole transport material composite by mixing a lead-free perovskite, a solvent and a liquid ionic conductor.

The method may include forming a precursor solution via a sonication when CsI is added to the solvent, forming the lead-free perovskite via a sonication when $SnI_4$ is added to the precursor solution, and mixing the lead-free perovskite, the solvent and the liquid ionic conductor, to form the hole transport material composite.

The forming of the lead-free perovskite may include performing the sonication at a temperature from a room temperature to 60° C.

Each of the forming of the precursor solution and the forming of the lead-free perovskite may include performing the sonication for 30 minutes to 5 hours at an intensity of 0.1 kilohertz (kHz) to 100 kHz.

A molar ratio of the $SnI_4$ to the CsI may range from 1:1 to 1:2.

The forming of the hole transport material composite may include forming the hole transport material composite at a temperature of 50° C. to 70° C.

Additional aspects of example embodiments will be set forth in part in the description which follows and, in part, will be apparent from the description, or may be learned by practice of the disclosure.

BRIEF DESCRIPTION OF THE DRAWINGS

These and/or other aspects, features, and advantages of the invention will become apparent and more readily appreciated from the following description of example embodiments, taken in conjunction with the accompanying drawings of which.

DETAILED DESCRIPTION

Figure 1:
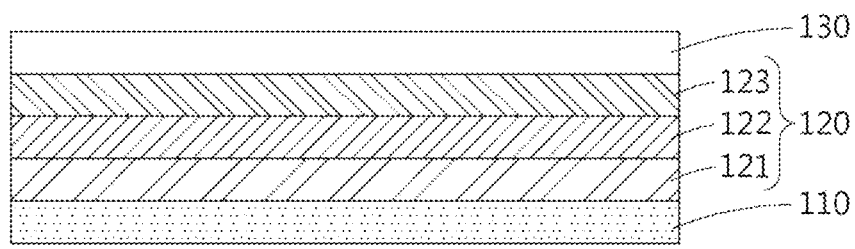
FIG. 1 illustrates a cross section of a solar cell according to an example embodiment.

Hereinafter, example embodiments of the present disclosure will be described in detail with reference to the accompanying drawings. When it is determined detailed description related to a related known function or configuration they may make the purpose of the present disclosure unnecessarily ambiguous in describing the present disclosure, the detailed description will be omitted here. Also, terms used herein are defined to appropriately describe the example embodiments and thus may be changed depending on a user, the intent of an operator, or a custom of a field to which the present disclosure pertains. Accordingly, the terms must be defined based on the following overall description of this specification. Like reference numerals present in the drawings refer to the like elements throughout.

According to an example embodiment, a hole transport material composite may be provided. A reproducibility and a performance of the hole transport material composite may be enhanced by applying a lead-free perovskite ($Cs_2SnI_6$) powder and a matrix that fixes the lead-free perovskite powder.

The hole transport material composite may include a lead-free perovskite ($Cs_2SnI_6$), a solvent and a liquid ionic conductor.

The lead-free perovskite ($Cs_2SnI_6$) may be a tin-based perovskite having an oxidation number of +4, and may be applicable as a semisolid electrolyte or a solid hole transport material because the lead-free perovskite is stable in the air and has an excellent charge mobility. Also, the lead-free perovskite may contribute to an enhancement of an efficiency and a stability of a solar cell.

The lead-free perovskite ($Cs_2SnI_6$) may be included in an amount of 0.1 to 10 parts by weight, in an amount of 0.1 to 5 parts by weight, or in an amount of 1 to 2 parts by weight, based on 100 parts by weight of the hole transport material composite. When the amount of the lead-free perovskite is within the above ranges, the lead-free perovskite may function as a hole transport material and may be uniformly distributed and fixed within a matrix.

The lead-free perovskite ($Cs_2SnI_6$) may be applied as a powder in the hole transport material composite. For example, the lead-free perovskite may be a powder that has a particle size of 1 nanometer (nm) or greater, a particle size of 10 nm to 2 micrometers (μm), a particle size of 10 nm to 1000 nm, or a particle size of 20 nm to 100 nm. By applying the lead-free perovskite ($Cs_2SnI_6$) as a powder, a long-term stability may be enhanced and the lead-free perovskite may function as a hole transport material with an enhanced reproducibility and performance.

The solvent may function as a matrix to fix the lead-free perovskite ($Cs_2SnI_6$) powder, and may form a semiconductor or a solid hole transport material composite. Also, the solvent may form a hole transport material composite in which an excellent performance and a stability of a lead-free perovskite ($Cs_2SnI_6$) is maintained.

For example, the solvent may be included in an amount of 80 parts by weight or greater, in an amount of 80 to 99 parts by weight, or in an amount of 80 to 90 parts by weight. When the amount of the solvent is within the above ranges, the solvent may continue to function as a matrix to fix and support the lead-free perovskite ($Cs_2SnI_6$) and may enhance a performance of a hole transport material.

The solvent may be a solid at a room temperature, and have a melting point of, for example, 50° C. or higher.

The solvent may be, for example, a succinonitrile-based compound. The succinonitrile-based compound may include, for example, at least one of succinonitrile, 2,2,3,3-tetramethylsuccinonitrile, tetramethylsuccinonitrile, methylsuccinonitrile, 2-methylsuccinonitrile, 2,2-dimethylsuccinonitrile, 2,3-dimethylsuccinonitrile, 2,3,3-trimethyl succinonitrile and 2,3-diethyl-2,3-dimethylsuccinonitrile, and may desirably be succinonitrile, 2,2,3,3-tetramethylsuccinonitrile and tetramethylsuccinonitrile. For example, to maintain the solvent almost in a solid state at the room temperature, one or more succinonitrile-based compounds may be mixed at an appropriate mixing ratio.

For example, as the solvent, a mixture of another solvent applicable to an electrolyte and the succinonitrile-based compound may be used. When the other solvent is mixed with the succinonitrile-based compound, a hole transport material composite may be maintained almost in a solid state (for example, a semisolid, a gel or a solid) at the room temperature. A mass ratio of the succinonitrile-based compound to the other solvent may range from 1:0.1 to 1:0.4, or range from 1:0.2 to 1:0.3. When the mass ratio is within the above ranges, a function of a matrix to fix and support the lead-free perovskite ($Cs_2SnI_6$) may be maintained by the succinonitrile-based compound, and the solvent and the lead-free perovskite ($Cs_2SnI_6$) may be properly mixed, to enhance a performance of a hole transport material.

For example, the other solvent may be a carbonate-based solvent, for example, ethylene carbonate, diethylene carbonate, ethyl methyl carbonate, and the like, malononitrile, glutaronitrile, adiponitrile, pimelonitrile, suberonitrile, azelanitrile, sebaconitrile, and the like.

The liquid ionic conductor may enhance a conductivity of the hole transport material composite.

For example, the liquid ionic conductor may be included in an amount of 0.1 to 20 parts by weight, in an amount of 1 to 20 parts by weight, or in an amount of 10 to 20 parts by weight. When the amount of the liquid ionic conductor is within the above ranges, the liquid ionic conductor may enhance the conductivity of the hole transport material composite and may maintain a function of the matrix based on the solvent by preventing the composite from being diluted.

The liquid ionic conductor may include, for example, an imidazolium salt. The liquid ionic conductor may include at least one of 1-butyl-3-methyl imidazolium iodide, 1-allyl-3-methylimidazolium iodide, 1,3-dimethylimidazolium iodide, 1-hexyl-2,3-dimethylimidazolium iodide, 1-butyl-2,3-dimethylimidazolium iodide, 1-dodecyl-3-methylimidazolium iodide, 1-butyl-3-methylimidazolium iodide, 1,2-dimethyl-3-propylimidazolium iodide (DMPII), 1-ethyl-3-methylimidazolium iodide, 1-hexyl-3-methylimidazolium iodide, 1-methyl-3-propylimidazolium iodide and 4-tert-butylpyridine (TBP).

A mass ratio of the lead-free perovskite ($Cs_2SnI_6$) to the liquid ionic conductor may range from 1:1 to 1:5, or from 1:1 to 1:3. When the mass ratio is within the above ranges, a conductivity of the hole transport material may be enhanced, to contribute to an enhancement of an efficiency of a solar cell.

A mass ratio of the solvent to the lead-free perovskite ($Cs_2SnI_6$) may range from 1:0.1 to 1:0.5, or from 1:0.1 to 1:0.2. When the mass ratio is within the above ranges, the lead-free perovskite ($Cs_2SnI_6$) powder may be evenly dispersed, may be properly fixed in the matrix, and may provide an excellent performance as a hole transport material in a formation of a hole transport material layer of a solar cell due to good workability of a hole transport material composite.

A mass ratio of the solvent to the liquid ionic conductor may range from 1:0.1 to 1:0.5, or from 1:0.2 to 1:0.3. When the mass ratio is within the above ranges, the solvent may properly function as a matrix and the conductivity of the hole transport material composite may be enhanced.

According to an example embodiment, the method may be used to form a composite by mixing a lead-free perovskite powder with a solvent and an ionic liquid, and thus a hole transport material with an enhanced reproducibility and performance may be provided. Also, a manufacturing process and manufacturing costs of a composite may be improved by improving a synthesis process of a lead-free perovskite.

In an example, the method may include forming a hole transport material composite by mixing a lead-free perovskite, a solvent and a liquid ionic conductor.

In the forming of the hole transport material composite, the lead-free perovskite may be prepared by a manufacturing method known in the art. Also, the above description of the hole transport material composite is also applicable to the lead-free perovskite.

In the forming of the hole transport material composite, the solvent in a solid or semisolid state (for example, a mixture of a solid and gel) may be liquefied and mixed with the lead-free perovskite and the liquid ionic conductor. The solvent may be liquefied by adjusting a temperature based on a melting point of the solvent. The melting point of the solvent may be 50° C. or higher, range from 50° C. to 200° C., range from 50° C. to 100° C., or range from 50° C. to 70° C.

In another example, the method may include forming a lead-free perovskite, and mixing the lead-free perovskite, a solvent and a liquid ionic conductor to form a hole transport material composite.

The forming of the lead-free perovskite may include forming a precursor solution via a sonication when CsI is added to the solvent, and forming the lead-free perovskite via a sonication when $SnI_4$ is added to the precursor solution. In the forming of the lead-free perovskite, a synthesis may be performed by a simple method via the sonication instead of using harsh and corrosive acids, HI, $H_3PO_4$, and the like, and a synthesis time may be reduced.

In the forming of the lead-free perovskite, the sonication may be performed at a temperature from the room temperature to 60° C., or a temperature from the room temperature to 50° C.

In each of the forming of the precursor solution and the forming of the lead-free perovskite, the sonication may be performed for 30 minutes to 5 hours at an intensity of 0.1 kilohertz (kHz) to 100 kHz.

In the forming of the lead-free perovskite, the $SnI_4$ may be added so that a molar ratio of the $SnI_4$ to the CsI may range from 1:1 to 1:2, or from 1:1.3 to 1:1.7.

In the mixing of the lead-free perovskite, the solvent and the liquid ionic conductor to form a hole transport material composite, the hole transport material composite may be formed using the lead-free perovskite synthesized in the forming of the lead-free perovskite, and a manufacturing process is as described above.

According to an example embodiment, a solar cell including a hole transport material composite may be provided. The solar cell may operate well by applying the hole transport material composite, to generate a high photocurrent and to enhance an efficiency of the solar cell.

FIG. 1 illustrates a cross section of a solar cell according to an example embodiment.

Referring to FIG. 1, the solar cell may include a first electrode 110, a second electrode 130, and a light absorption layer 120. The light absorption layer 120 may be located between the first electrode 110 and the second electrode 130, and may include a hole transport material layer 123 that includes a hole transport material composite.

For example, each of the first electrode 110 and the second electrode 130 may be a working electrode or a counter electrode. All configurations applicable to a solar cell in the art may be applied to the first electrode 110 and the second electrode 130 without a limitation.

The first electrode 110 may include a transparent substrate and a conductive metal oxide film. The conductive metal oxide film may include, for example, indium tin oxide (ITO), fluorine-doped tin oxide (FTO), ZnO—($Ga_2O_3$ or $Al_2O_3$), tin-based oxide, antimony tin oxide (ATO), zinc oxide (ZnO), and the like. The conductive metal oxide film may be formed on the transparent substrate.

The transparent substrate may be formed of a glass or plastic, and may include, for example, polyethylene terephthalate, polyethylene naphthalate, polycarbonate, polypropylene, polyimide, triacetylcellulose, and the like.

The second electrode 130 may be formed on the hole transport material layer 123, and may include a transparent substrate, a transparent electrode and/or a catalyst electrode. The transparent electrode may be formed on the transparent substrate.

The transparent electrode may be formed on the transparent substrate, and may be formed of a transparent material, for example, ITO, FTO, ATO, ZnO, tin oxide, ZnO—($Ga_2O_3$ or $Al_2O_3$), and the like. The transparent substrate may be the same as described above in the first electrode 110, and may be the same as or different from the transparent substrate of the first electrode 110.

The catalyst electrode may be formed on the transparent substrate or the transparent electrode, and may function to activate a redox couple. The catalyst electrode may include, for example, at least one of platinum (Pt), gold (Au), ruthenium (Ru), palladium (Pd), rhodium (Rh), iridium (Ir), osmium (Os), carbon (C), titanium dioxide ($TiO_2$) and a conductive polymer.

The light absorption layer 120 may be formed on the first electrode 110, and may include a configuration of a light absorption layer applied to a solar cell applied in the art. The light absorption layer 120 may be, for example, a light absorption layer of a dye-sensitized solar cell.

The light absorption layer 120 may include a semiconductor fine particle layer 121, a dye layer 122, and the hole transport material layer 123. The dye layer 122 may include a dye or a mixture of a dye and semiconductor fine particles.

The semiconductor fine particle layer 121 may include metallic oxide, for example, titanium (Ti), tin (Sn), zinc (Zn), tungsten (W), zirconium (Zr), gallium (Ga), indium (In), yttrium (Y), niobium (Nb), tantalum (Ta) and vanadium (V), and may include, for example, titanium dioxide ($TiO_2$), tin oxide ($SnO_2$), zinc oxide (ZnO), niobium oxide ($Nb_2O_5$), titanium strontium oxide ($TiSrO_3$), and the like.

The semiconductor fine particles may have an average particle size of 1 nm to 1,000 nm, or an average particle size of 1 nm to 500 nm.

The dye layer 122 may include a dye (for example, Ru(etc bpy)$_2$(NCS)$_2$.$CH_3CN$), and an organic pigment. The dye may include an organometallic complex, and the organometallic complex may include, for example, at least one of aluminum (Al), platinum (Pt), palladium (Pd), europium (Eu), lead (Pb), iridium (Ir) and ruthenium (Ru). The organic pigment may include, for example, at least one of coumarin, porphyrin, xanthene, riboflavin, triphenylmethane, and the like.

The hole transport material layer 123 may include a hole transport material composite according to an example embodiment. The hole transport material layer 123 may have a thickness of 10 nm or greater, a thickness of 1 μm or greater, a thickness of 10 μm to 30 μm, or a thickness of 20 μm to 30 μm.

EXAMPLE (1) Synthesis of Lead-Free Perovskite ($Cs_2SnI_6$)

CsI was added in a methanol solvent and was melt via a sonication, $SnI_4$ was further added, and a sonication was performed for 1 hour or longer, to acquire a $Cs_2SnI_6$ powder. A molar ratio of the CsI to the $SnI_4$ was 1.6:1.

(2) Preparation of $Cs_2SnI_6$-Based Hole Transport Material Composite 0.1 g of lead-free perovskite ($Cs_2SnI_6$) and 0.2 g of DMPII were added in 1 g of succinonitrile, and stirring was performed at about 60° C., to prepare a composite in a form of a black mass.

(3) Manufacture of Device

Figure 2A:
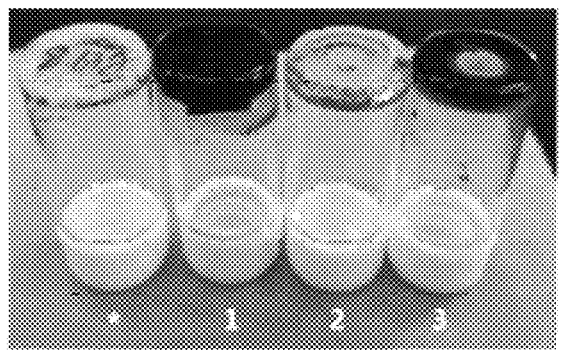
FIGS. 2A and 2B illustrate samples prepared in an example for an analysis of characteristics, and a solar cell device according to an example embodiment.
Figure 2B:
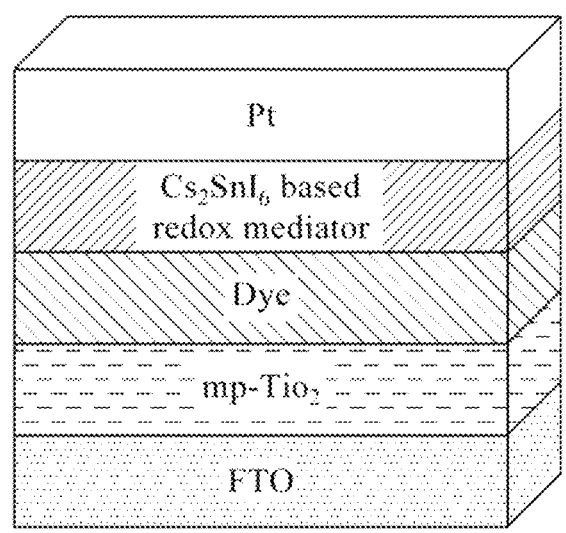

A $Cs_2SnI_6$-based hole transport material composite was injected into a hole drilled in a counter electrode at about 60° C. or was placed on an anode, and the counter electrode was bonded in a sandwich type, to manufacture a device with a structure of FIG. 2B.

Device 1:

A BT-T2 dye of Formula 1 shown below was used as a photoactive material, and $TiO_2$ in which an adsorption of a dye occurs was used as a large-pore MC paste that enables an easy penetration of a material.

[Formula 1]

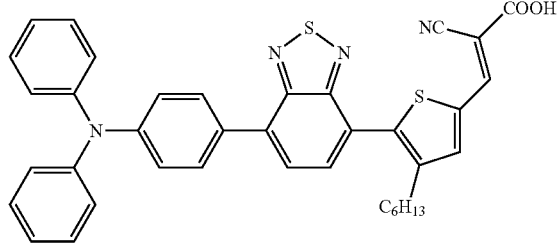

Device 2:

A DAHTDTT dye of Formula 2 shown below was used as a photoactive material, and $TiO_2$ in which an adsorption of a dye occurs was used as a large-pore MC paste that enables an easy penetration of a material.

[Formula 2]

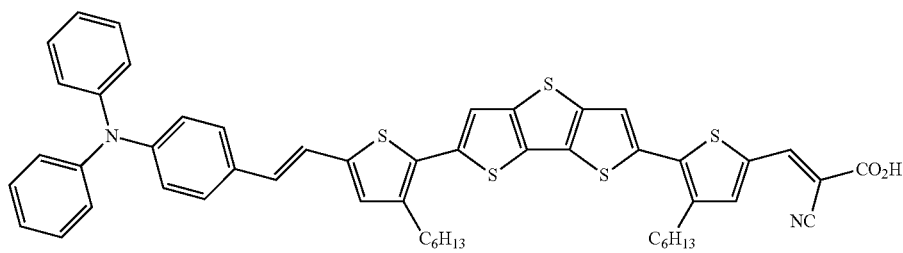

Experimental Example 1

To analyze a function of each of $Cs_2SnI_6$ and DMPII included in a $Cs_2SnI_6$-based hole transport material, optical and electrical properties were evaluated. In addition, a $Cs_2SnI_6$ bulk powder and a mixture sample of $Cs_2SnI_6$ in succinonitrile were prepared, and device samples, each including the $Cs_2SnI_6$ bulk powder and the mixture sample, were prepared based on the same configuration and method as those of the example. Optical and electrical properties of the device samples were evaluated as shown in FIGS. 3 through 8 and Tables 1 through 4.

(1) X-Ray Diffraction (XRD)

XRD measurements were performed with respect to the example and the above-described samples, and whether a crystal structure of $Cs_2SnI_6$ in the $Cs_2SnI_6$-based hole transport material is maintained in a $Cs_2SnI_6$-based hole transport material composite was determined through the XRD measurements.

(2) Ionic Conductivity

To compare relative ionic conductivities, specific resistances based on temperatures of the samples were measured. Measurements were performed by preparing a dummy cell in which both electrodes are bonded to FTO coated with Pt. For the measurements, an alternating current (AC) voltage of 10 mV was applied in a dark state, a measurement range was a range of $10^{-1}$ Hz to $10^5$ Hz, and the dummy cell was heated for 5 minutes, to reach an equilibrium temperature.

(3) Electrochemical Impedance Spectroscopy (EIS)

An EIS was measured to compare and analyze resistance elements of three selected samples and a resistance element of a device in which an iodine electrolyte that is widely used as an electrolyte of a dye-sensitized solar cell is introduced. For measurements, an AC voltage of 10 mV was applied in a 1 sun state, a measurement range was a range of $10^{-1}$ Hz to $10^5$ Hz, and a Nyquist plot was fitted using ZView software, to calculate a sheet resistance, an interfacial resistance between an electrolyte and a counter electrode, a charge transfer resistance and a resistance by a diffusion.

(4) J-V Curve Measurement

To prevent an overestimation of an efficiency, a mask was put on the device and measurements was performed under a 1 sun condition.

(5) Time-Correlated Single Photon Counting (TCSPC)

Based on a reduction in a PL lifetime of a dye in which an electron of a HOMO was excited by absorbing light, an indirect regeneration efficiency of four samples may be calculated.

A regeneration efficiency(*The indirect regeneration efficiency may be calculated using an equation "$\eta_{reg}=1-\tau_{sample}/\tau_{inert}$." Here, a metal oxide to which a dye is adsorbed is $ZrO_2$. Since $ZrO_2$ has a high C.B, the excited electron is not injected.

(6) Intensity-Modulated Photocurrent Spectroscopy (IMPS) & Intensity-Modulated Photovoltage Spectroscopy (IMVS)

Through an IMPS, a charge transport time of an electron in $TiO_2$ may be calculated. Through an IMVS, a recombination time between $TiO_2$ or an excited dye and a regenerator may be calculated. The IMPS was used to measure a change in a photocurrent by irradiating the device with light of a specific short wavelength having a constant intensity, and the IMVS was used to measure a change in a photovoltage under the same condition.

Figure 3:
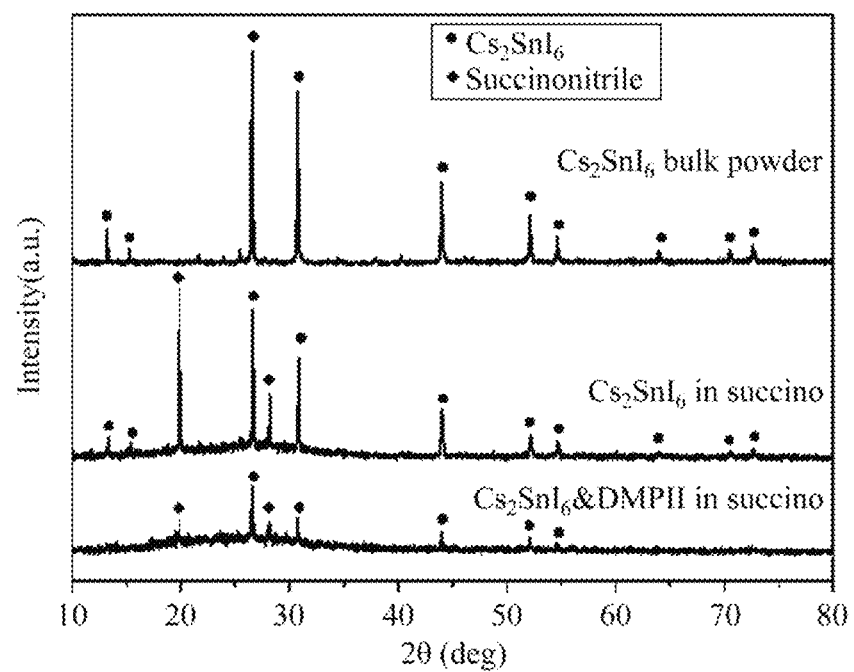
FIG. 3 illustrates an x-ray diffraction (XRD) pattern of a hole transport material manufactured in the example.

Measurement Results (1) Referring to FIG. 3, a crystal peak corresponding to a crystal structure of each of $Cs_2SnI_6$ and succinonitrile was found in a case in which only $Cs_2SnI_6$ was introduced into succinonitrile, and a crystal peak of $Cs_2SnI_6$ was found even when DMPII was additionally introduced. Also, an overall peak intensity decreases, because the DMPII disrupts the crystal structure of the succinonitrile to lead to a change from a solid to a semisolid and a sensed x-ray intensity was reduced. Thus, based on XRD results, it may be found that $Cs_2SnI_6$ properly coexists in the $Cs_2SnI_6$-based hole transport material.

Figure 4:
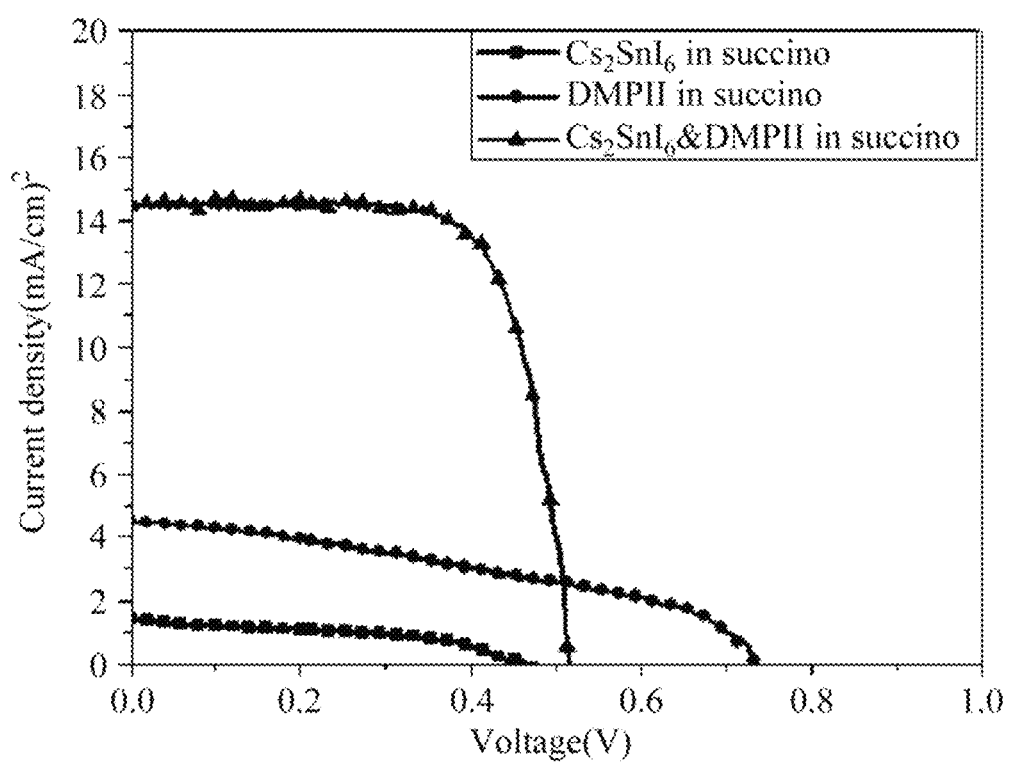
FIG. 4 illustrates a result obtained by measuring an efficiency of a solar cell device including the hole transport material manufactured in the example.

(2) Table 1 and FIG. 4 show results obtained by evaluating capabilities of a regenerator for each condition by manufacturing devices including each of samples. In the device, a BT-T2 dye was used as a photoactive material, and $TiO_2$ in which an adsorption of a dye occurs was used as a large-pore MC paste that enables an easy penetration of a material.

As shown in a device efficiency result of FIG. 4, when only $Cs_2SnI_6$ was introduced into succinonitrile and when only DMPII was introduced into succinonitrile, an extremely low efficiency, that is, 0.4% and 1.3% was obtained. However, when $Cs_2SnI_6$ coexists with DMPII that is an additive, the efficiency greatly increases to 5.5%. Thus, it may be found that the DMPII has a great influence on a regeneration process.

TABLE 1

| Dye | Regenerator | Voc (V) | Jsc (mA/cm$^2$) | FF | n (%) |
|---|---|---|---|---|---|
| BT-T2 | $Cs_2SnI_6$ in succino | 0.47 | 1.4 | 43.4 | 0.3 |
| | DMPII in succino | 0.74 | 4.5 | 39.0 | 1.3 |
| | $Cs_2SnI_6$&DMPII in succino | 0.52 | 14.5 | 73.5 | 5.5 |

Figure 5:
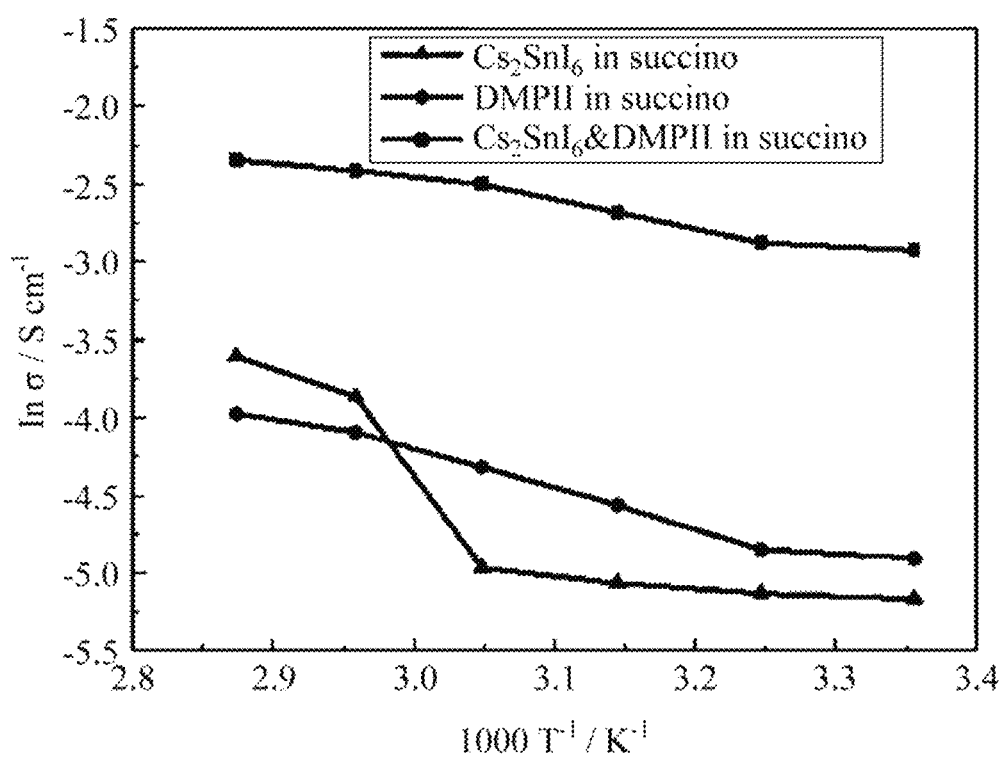
FIG. 5 illustrates a result obtained by measuring an ionic conductivity of the hole transport material manufactured in the example.

(3) Table 2 and FIG. 5 show results obtained by measuring an ionic conductivity to verify a charge transfer capability of each sample, to explain a cause of device efficiency results. In FIG. 5, based on an Arrhenius plot, a conductivity of a material may be found through a resistance measurement based on a temperature of a sample. Also, it may be found that a candidate group in which $Cs_2SnI_6$ and DMPII were added has a high conductivity over an entire temperature range, and that the conductivity was enhanced by about 8 times when conductivities were compared at the room temperature. Thus, it may be found that a great increase in a device efficiency contributes to an enhancement of a conductivity of a hole transport material.

TABLE 2

| | Conductivity parameter | |
|---|---|---|
| Sample | Activation energy (kJmol$^{-1}$) | Conductivity at R.T (mScm$^{-1}$) |
| $Cs_2SnI_6$ in succinonitrile | 11.0/25.3 | 0.06 |
| DMPII in succinonitrile | 17.7 | 0.07 |
| $Cs_2SnI_6$&DMPII in succinonitrile | 11.0 | 0.5 |

Figure 6:
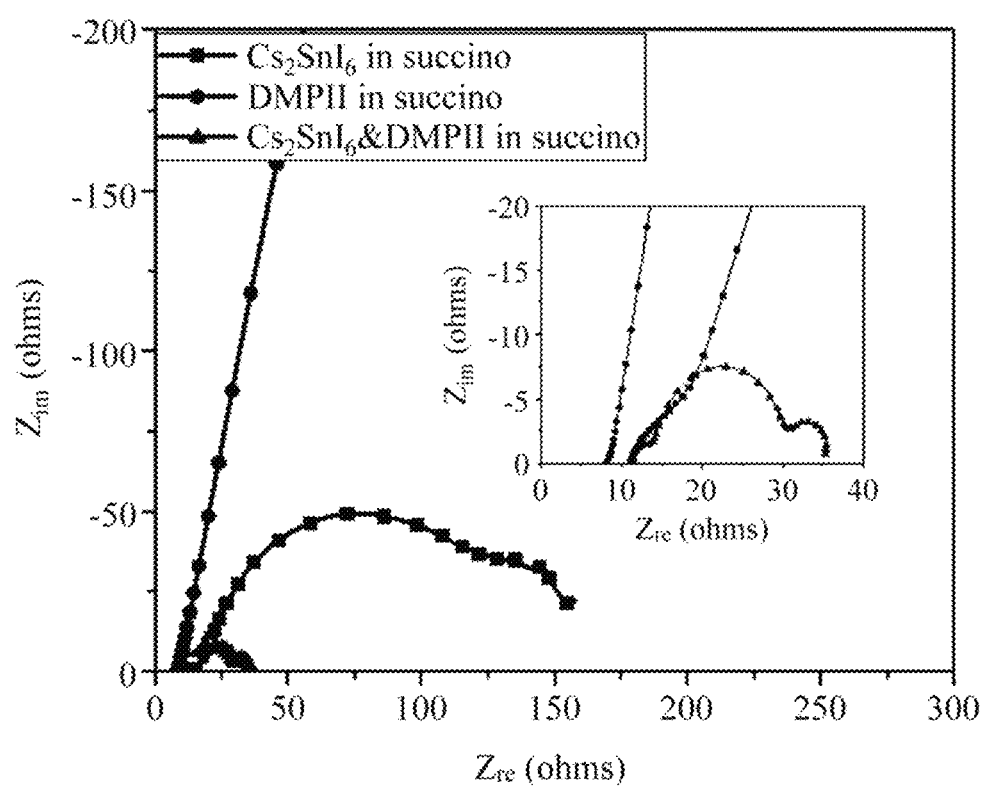
FIG. 6 illustrates a result obtained by measuring a resistance of a solar cell device including the hole transport material manufactured in the example.

(4) Table 3 and FIG. 6 show results obtained by measuring an EIS to analyze an internal resistance of a device into which a sample of each condition was introduced. Through an EIS measurement, a Nyquist plot was obtained, and accordingly a sheet resistance ($R_s$), an interfacial resistance ($R_{pt}$) between a counter electrode and a regenerator, a charge transfer resistance ($R_{ct}$) of charge injected into $TiO_2$, and a resistance ($W_d$-R) by a diffusion of a regenerator may be calculated. It may be found that there is no great difference in the sheet resistance, because the sheet resistance is a resistance between an FTO substrate and $TiO_2$ and the same manufacturing process was performed except for an introduction of the same regenerator, and that a charge transfer resistance of succinonitrile including only $Cs_2SnI_6$ was greatly reduced by adding DMPII when comparing charge transfer resistances between $TiO_2$ and an interface of the regenerator. Thus, it may be found that the $Cs_2SnI_6$ and DMPII added in the succinonitrile smoothly move charges. Also, because the $Cs_2SnI_6$-based hole transport material is in a semisolid state, the resistance by diffusion clearly appears, and a sample in which only the DMPII was added exhibits a similar resistance to a capacitor resistance unlike a resistance of an operating device. Thus, it may be found that the $Cs_2SnI_6$ is a main element to move charges.

TABLE 3

| Regenerator | $R_s^a(\Omega)$ | $R_{pt}^b(\Omega)$ | $R_{ct}^c(\Omega)$ | $W_d$-R |
|---|---|---|---|---|
| $Cs_2SnI_6$ in succinonitrile | 11.3 | 8.0 | 120.7 | — |
| DMPII in succinonitrile | — | — | — | — |
| $Cs_2SnI_6$&DMPII in succinonitrile | 10.7 | 3.4 | 16.2 | 5.0 |

Figure 7:
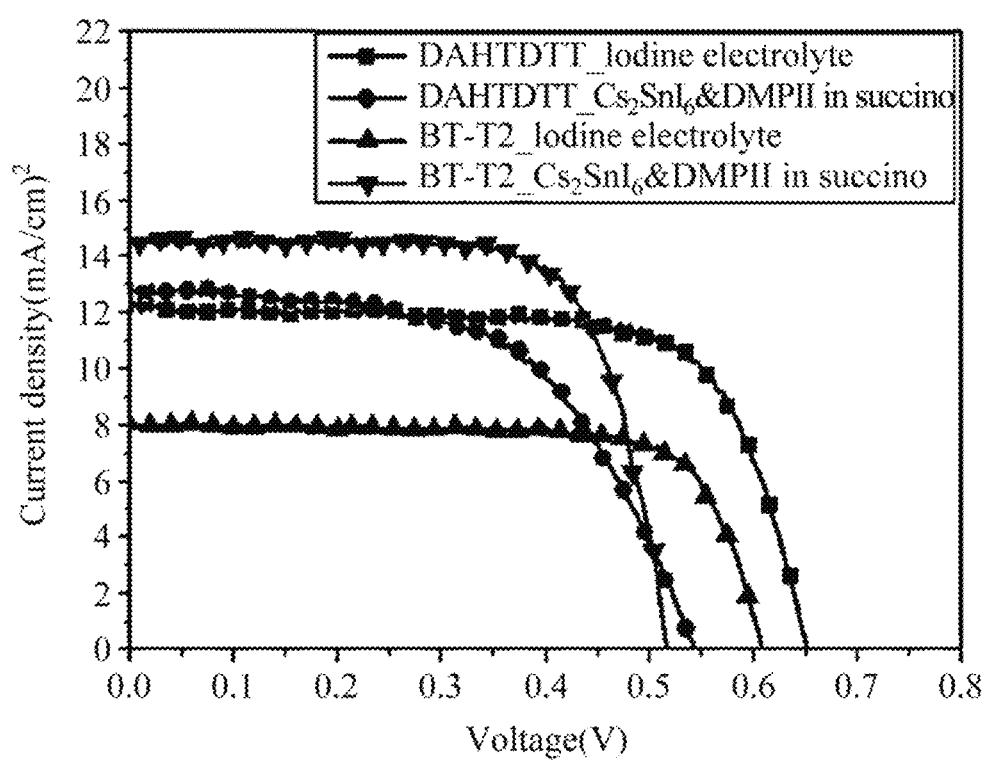
FIG. 7 illustrates a result obtained by measuring an efficiency of a solar cell device including dyes and the hole transport material manufactured in the example.

(5) Table 4 and FIG. 7 show results obtained by a comparison of an efficiency with an iodine electrolyte that is generally used to compare and evaluate a capability of a $Cs_2SnI_6$-based hole transport material. Also, to find out what kind of an interaction with a dye having a different energy band structure, evaluation of the device 2 to which the DAHTDTT dye is applied instead of BT-T2 was compared.

In Table 4 and FIG. 7, it may be found that in the DAHTDTT, the iodine electrolyte exhibits a higher efficiency than that of the $Cs_2SnI_6$-based hole transport material, whereas in the BT-T2, the $Cs_2SnI_6$-based hole transport material has a higher efficiency than that of the iodine electrolyte, which is caused by a high photocurrent, not an internal voltage (Voc) and a fill factor (FF) of a device.

TABLE 4

| | $TiO_2$: MC(1.8 + 1.8(scatter) um), C.E: Pt | | | | |
|---|---|---|---|---|---|
| Dye | Regenerator | Voc (V) | Jsc (mA/cm$^2$) | FF | n (%) |
| DAHTDTT | Liquid-Iodine (E2) | 0.65 | 12.4 | 71.5 | 5.7 |
| | $Cs_2SnI_6$&DMPII in succino | 0.54 | 12.9 | 57.1 | 4.0 |
| BT-T2 | Liquid-Iodine (E6) | 0.67 | 7.9 | 79.2 | 4.2 |
| | $Cs_2SnI_6$&DMPII in succino | 0.58 | 13.8 | 66.6 | 5.3 |

Figure 8:
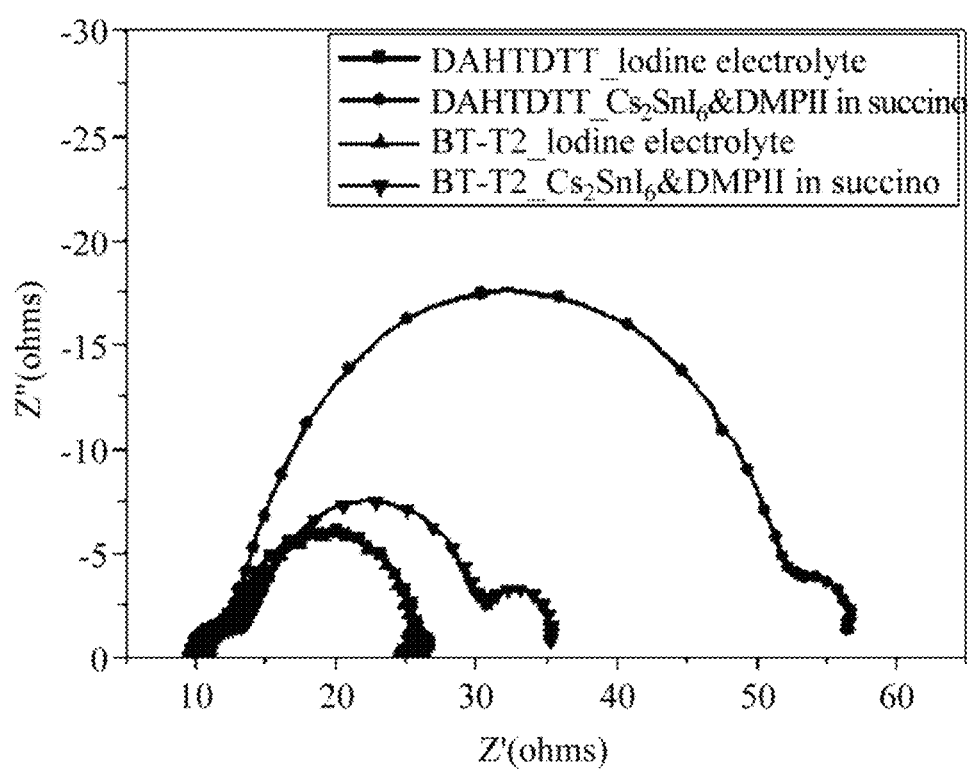
FIG. 8 illustrates a result obtained by measuring a resistance of a solar cell device including an iodine electrolyte and the hole transport material manufactured in the example.

(6) Table 5 and FIG. 8 show results obtained by EIS measurements to find out an internal resistance of a device. When two dyes, that is, BT-T2 and DAHTDTT, are introduced together with a $Cs_2SnI_6$-based hole transport material, a great charge transfer resistance was obtained in comparison to an iodine electrolyte. Also, although a diffusion resistance was not observed in the iodine electrolyte, a diffusion resistance was observed in the $Cs_2SnI_6$-based hole transport material. To analyze a cause to generate a high current despite a higher resistance than the iodine electrolyte, Equation 1 was applied to analyze each element that determines a current.

Photo-current=LHE×$\phi_{inj}$×$\eta_{reg}$×$\eta_{coll}$  [Equation 1]

As a result of EIS measurements to find out an internal resistance of a device, a great charge transfer resistance was obtained when the two dyes were introduced together with the $Cs_2SnI_6$-based hole transport material, in comparison to the iodine electrolyte. Also, although a diffusion resistance was not observed in the iodine electrolyte, a diffusion resistance was observed in the $Cs_2SnI_6$-based hole transport material.

TABLE 5

| Dye | Regenerator | $R_s^a$ ($\Omega$) | $R_{pt}^b$ ($\Omega$) | $R_{ct}^c$ ($\Omega$) | $W_d$-R |
|---|---|---|---|---|---|
| BT-T2 | Liquid-Iodine | 8.9 | 9.1 | 8.9 | — |
| | $Cs_2SnI_6$&DMPII in succinonitrile | 10.7 | 3.4 | 16.2 | 5.0 |
| DAHTDTT | Liquid-Iodine | 9.0 | 13.8 | 3.7 | — |
| | $Cs_2SnI_6$&DMPII in succinonitrile | 9.3 | 4.1 | 38.1 | 6.1 |

$^a$Series resistance,
$^b$Interface resistance b/w Pt electrode and electrolyte
$^c$Charge transfer resistance,
$^d$Diffusion resistance (7) FIGS. 9A through 9D illustrate an IMPS measurement result, an IMVS measurement result, a charge collection efficiency and a diffusion length.

Figure 9A:
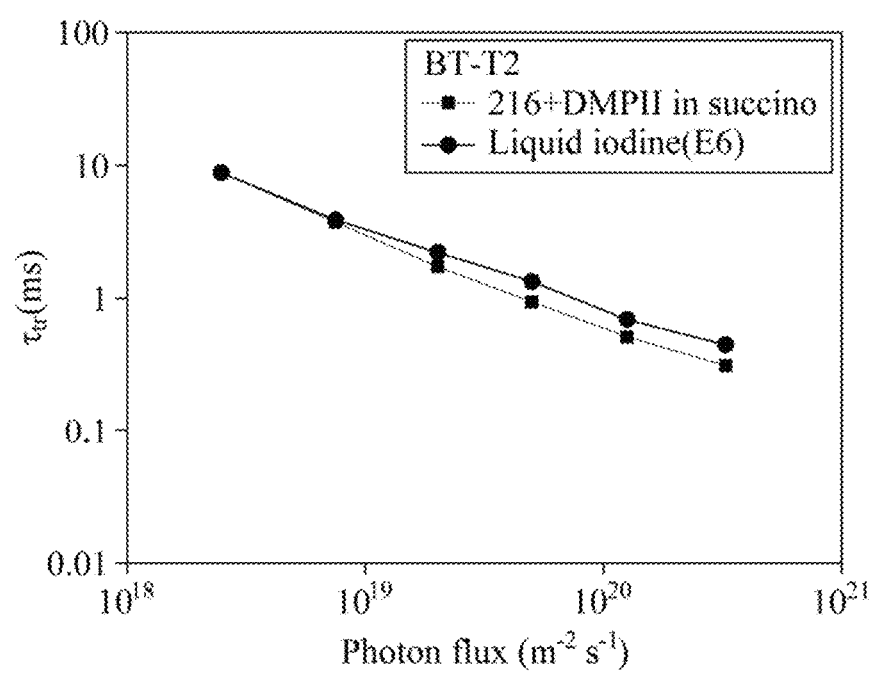
FIGS. 9A through 9D illustrate an intensity-modulated photocurrent spectroscopy (IMPS) measurement result and an intensity-modulated photovoltage spectroscopy (IMVS) measurement result of a BT-T2 dye-sensitized solar cell based on iodine and the hole transport material manufactured in the example, and a charge collection efficiency and a diffusion length based on the IMPS measurement result and the IMVS measurement result.
Figure 9B:
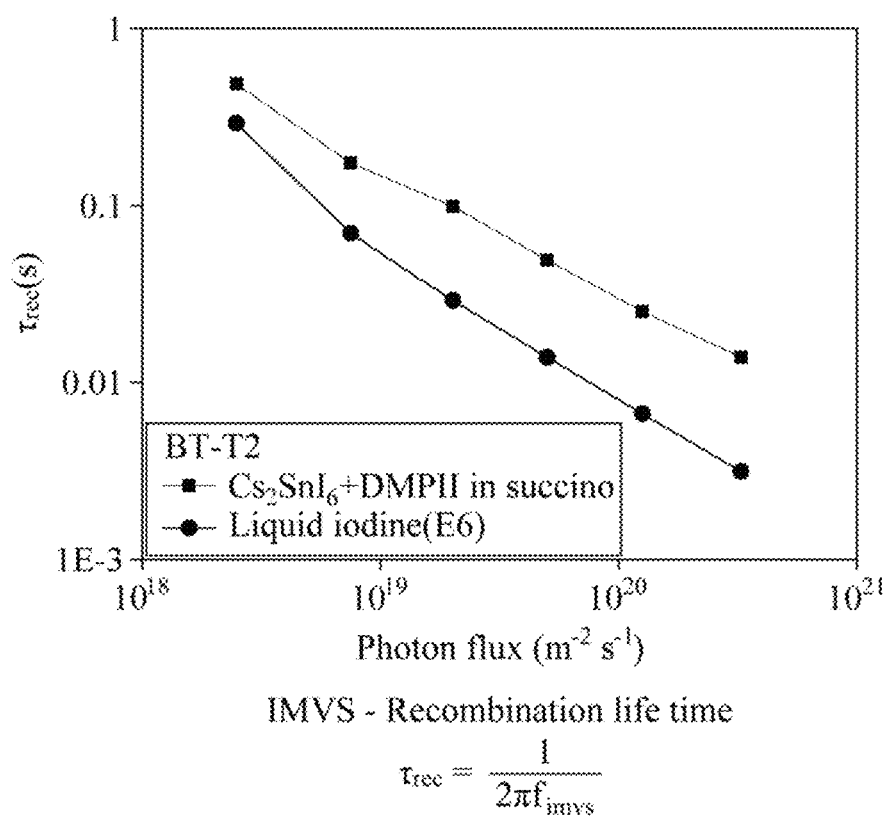
Figure 9C:
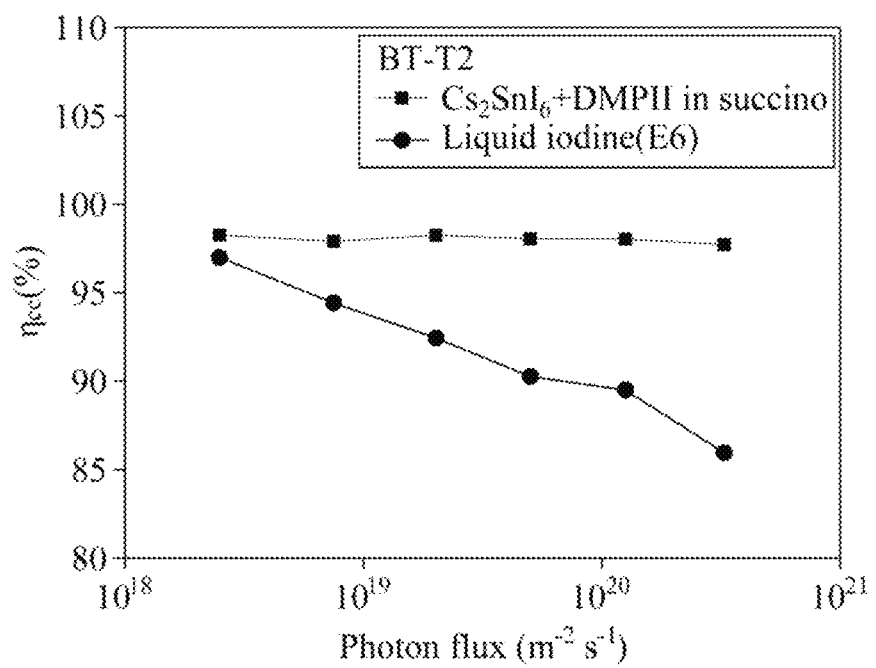
Figure 9D:
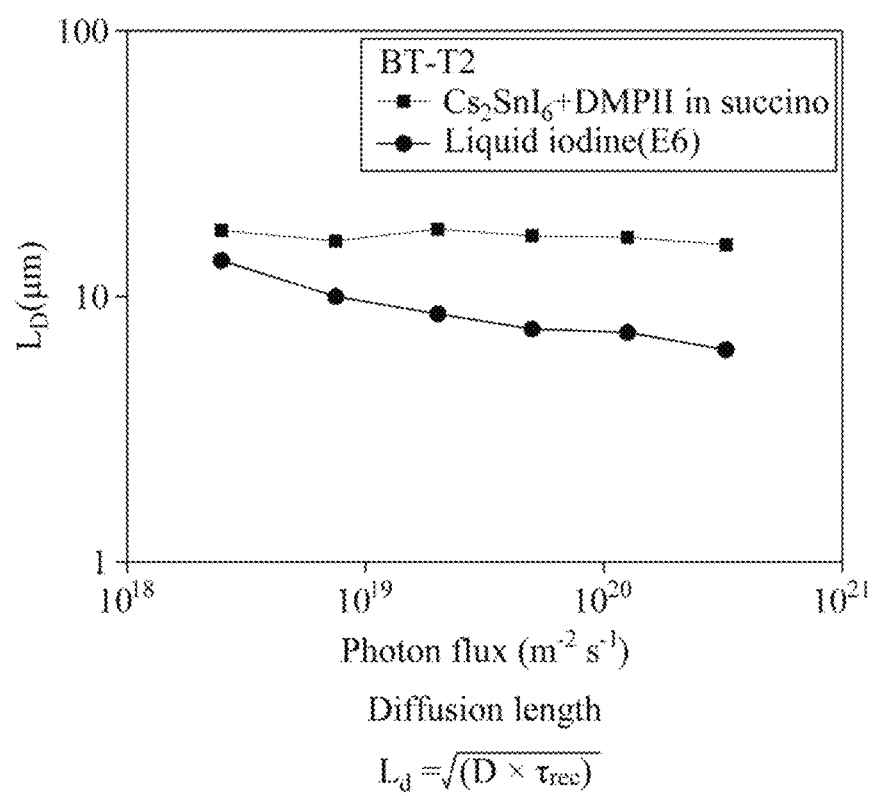

In FIG. 9C, the charge collection efficiency is an indicator of how efficiently a generated photocurrent is collected in a conductive substrate (FTO). Also, the charge collection efficiency may be calculated based on a charge transport time of an electron introduced into $TiO_2$ in the IMPS and based on a recombination time between a regenerator and $TiO_2$ or an oxidized dye in the IMVS. The IMPS was used to measure a changed photocurrent after light with a specific frequency and an adjusted intensity was irradiated onto a sample, and the IMVS was used to measure a photovoltage in a similar process. It may be found that a $Cs_2SnI_6$-based hole transport material quickly transfers charges in comparison to an iodine electrolyte although there is no great difference in the charge transport time between the $Cs_2SnI_6$-based hole transport material and the iodine electrolyte. Also, it may be found that a recombination time for the $Cs_2SnI_6$-based hole transport material is very longer than that of the iodine electrolyte, which indicates that a number of times a recombination between the electron introduced into $TiO_2$ and the $Cs_2SnI_6$-based hole transport material occurs is significantly less than that of the iodine electrolyte.

The charge collection efficiency was calculated using the following two constants. As an intensity of light increases, an efficiency of the iodine electrolyte gradually decreases. However, in the $Cs_2SnI_6$-based hole transport material, a high charge collection efficiency is maintained regardless of an intensity of light. Also, a diffusion length of charges in a material may be calculated through IMPS and IMVS measurements. It may be found that the $Cs_2SnI_6$-based hole transport material exhibits a longer diffusion length, which is associated with a result in that the number of times the recombination occurs less than that of the iodine electrolyte.

Table 6 shows results obtained by analyzing a regeneration efficiency using a TCSPC under an assumption of the same election injection at an extremely high kinetic based on a dye that uses an LHE.

TABLE 6

| Dye | Component | Lifetime (ps) | Regeneration (%) |
|---|---|---|---|
| BT-T2 dye | Succinonitrile only | 707 | — |
| | $Cs_2SnI_6$ in succino | 198 | 72 |
| | DMPII in succino | 701 | 0 |
| | $Cs_2SnI_6$&DMPII in succino | 304 | 57 |
| | Inert electrolyte | 869 | — |
| | Liquid iodine | 566 | 35 |

To compare regeneration efficiencies of the iodine electrolyte and the $Cs_2SnI_6$-based hole transport material, a PL lifetime of a dummy cell was measured using TCSPC equipment. The dummy cell was prepared by adsorbing a dye adsorbed on $ZrO_2$ that has a high CB and in which an injection of an excited electron from the dye is impossible. The excited electron emits photoluminescence (PL) while falling to a bottom state of the dye, however, the PL lifetime may be reduced when the dye is regenerated by a regenerator. Based on the above process, regeneration efficiencies of the samples may be obtained indirectly through the above equation. The iodine electrolyte has an extremely low efficiency, that is, 35%, due to a lifetime of 869 picoseconds (ps) of an inert electrolyte that does not have a regeneration source and 566 ps of an iodine electrolyte including iodine. Also, a lifetime of succinonitrile was greatly reduced from 707 ps to 198 ps after $Cs_2SnI_6$ was introduced, and was then slightly reduced to 304 ps after DMPII was added. However, the $Cs_2SnI_6$-based hole transport material exhibits an extremely high regeneration efficiency of 57% in comparison to the iodine electrolyte. In addition, since a reduction in the PL lifetime was not observed in a case in which only the DMPII is added, it may be found that a regeneration of a dye occurs due to the $Cs_2SnI_6$ not the DMPII. Thus, it may be found that a regeneration process is performed by $Cs_2SnI_6$ and that the $Cs_2SnI_6$-based hole transport material is regenerated more actively than the iodine electrolyte.

According to example embodiments, in a $Cs_2SnI_6$-based hole transport material, a performance of a perovskite ($Cs_2SnI_6$) may be enhanced, and an efficiency by a current may be higher than that of an iodine electrolyte in an existing BT-T2 dye-based device. The $Cs_2SnI_6$-based hole transport material may have a higher efficiency than that of existing iodine, due to a high regeneration efficiency and a high charge collection efficiency.

According to example embodiments, it is possible enhance a reproducibility and a performance of a hole transport material by applying a matrix configured to fix a lead-free perovskite ($Cs_2SnI_6$) powder.

According to example embodiments, by applying a lead-free perovskite ($Cs_2SnI_6$)-based hole transport material to an organic dye-sensitized solar cell, it is possible to generate a high photocurrent, to achieve a high efficiency.

Although a few example embodiments of the present disclosure have been shown and described, the present disclosure is not limited to the described example embodiments. Instead, it would be appreciated by those skilled in the art that changes may be made to these example embodiments without departing from the principles and spirit of the present disclosure, the scope of which is defined by the claims and their equivalents.

What is claimed is:

1. A hole transport material composite comprising a mixture that comprises:
    a lead-free perovskite of formula $Cs_2SnI_6$;
    succinonitrile; and
    1,2-dimethyl-3-propylimidazolium iodide (DMPII),
    wherein the succinonitrile functions as a matrix within which the lead-free perovskite is uniformly distributed and fixed.

2. The hole transport material composite of claim 1, wherein the lead-free perovskite is included in an amount of 0.1 to 10 parts by weight, the succinonitrile is included in an amount of 80 to 99 parts by weight, and the DMPII is included in an amount of 0.1 to 20 parts by weight, based on 100 parts by weight of the hole transport material composite.

3. The hole transport material composite of claim 1, wherein a mass ratio of the lead-free perovskite to the DMPII ranges from 1:1 to 1:5.

4. The hole transport material composite of claim 1, wherein a mass ratio of the succinonitrile to the lead-free perovskite ranges from 1:0.1 to 1:0.5.

5. The hole transport material composite of claim 1, wherein a mass ratio of the succinonitrile to the DMPII ranges from 1:0.1 to 1:0.5.

6. The hole transport material composite of claim 1, wherein the lead-free perovskite is powder with a particle size of 10 nanometers (nm) to 2 micrometers (μm).

7. A solar cell comprising:
    a light absorption layer comprising a hole transport material layer comprising the hole transport material composite of claim 1, the light absorption layer being located between a first electrode and a second electrode.

8. The solar cell of claim 7, wherein the solar cell comprises:
    the first electrode;
    the light absorption layer formed on the first electrode; and
    the second electrode formed on the light absorption layer,
    wherein the light absorption layer comprises a dye layer, and the hole transport material layer formed on the dye layer.

9. The solar cell of claim 7, wherein the hole transport material layer has a thickness of 10 micrometers (μm) to 30 μm.

10. A method of manufacturing the hole transport material composite according to claim 1, the method comprising:
    forming the hole transport material composite by mixing the lead-free perovskite of formula $Cs_2SnI_6$, the succinonitrile, and the DMPII.

11. The method of claim 10, wherein the method comprises: forming a precursor solution by adding CsI to the succinonitrile and performing sonication; forming the lead-free perovskite by adding $SnI_4$ to the precursor solution and performing sonication; and mixing the lead-free perovskite, the succinonitrile, and the DMPII, to form the hole transport material composite.

12. The method of claim 11, wherein the forming of the lead-free perovskite comprises performing the sonication at a temperature from a room temperature to 60° C.

13. The method of claim 11, wherein each of the forming of the precursor solution and the forming of the lead-free perovskite comprises performing the respective sonication for 30 minutes to 5 hours at an intensity of 0.1 kilohertz (kHz) to 100 kHz.

14. The method of claim 11, wherein a molar ratio of the $SnI_4$ to the CsI ranges from 1:1 to 1:2.

15. The method of claim 10, wherein the forming of the hole transport material composite comprises forming the hole transport material composite at a temperature of 50° C. to 70° C.

* * * * *